(12) United States Patent
Götzenberger et al.

(10) Patent No.: US 7,332,942 B2
(45) Date of Patent: Feb. 19, 2008

(54) OPERATION OF A HALF-BRIDGE, IN PARTICULAR A FIELD-EFFECT TRANSISTOR HALF-BRIDGE

(75) Inventors: Martin Götzenberger, Ingolstadt (DE); Michael Kirchberger, Neutraubling (DE); Wolfgang Speigl, Sinzing-Viehhausen (DE)

(73) Assignee: Siemens Aktiengesellschaft, Munich (DE)

( * ) Notice: Subject to any disclaimer, the term of this patent is extended or adjusted under 35 U.S.C. 154(b) by 251 days.

(21) Appl. No.: 10/546,075
(22) PCT Filed: Feb. 16, 2004
(86) PCT No.: PCT/EP2004/001443
§ 371 (c)(1), (2), (4) Date: Aug. 18, 2005
(87) PCT Pub. No.: WO2004/075405
PCT Pub. Date: Sep. 2, 2004

(65) Prior Publication Data
US 2007/0115705 A1 May 24, 2007

(30) Foreign Application Priority Data
Feb. 18, 2003 (DE) ................. 103 06 809

(51) Int. Cl.
*H03K 3/353* (2006.01)
*H03K 3/02* (2006.01)
(52) U.S. Cl. ........................ 327/109; 327/424; 327/588
(58) Field of Classification Search ........ 327/108–112, 327/389, 424, 427, 434, 581, 426, 436, 588; 323/224, 225
See application file for complete search history.

(56) References Cited

U.S. PATENT DOCUMENTS

| | | | |
|---|---|---|---|
| 4,873,460 A | 10/1989 | Rippel | |
| 5,140,201 A | 8/1992 | Uenishi | |
| 5,646,837 A | 7/1997 | Weggel | |
| 6,094,087 A * | 7/2000 | He et al. | 327/434 |
| 6,215,634 B1 | 4/2001 | Terasawa | |
| 6,441,673 B1 | 8/2002 | Zhang | |
| 6,570,416 B1 * | 5/2003 | Isurin et al. | 327/109 |

FOREIGN PATENT DOCUMENTS

| | | |
|---|---|---|
| DE | 41 10 633 A1 | 10/1991 |
| DE | 195 16 138 C1 | 12/1996 |

(Continued)

*Primary Examiner*—Gary L Laxton
(74) *Attorney, Agent, or Firm*—Laurence A. Greenberg; Werner H. Stemer; Ralph E. Locher

(57) ABSTRACT

The invention relates to a circuit configuration (1) for controlling the operation of a half-bridge (13) by pulse-width modulation, especially in a synchronous rectifier mode. Said circuit configuration comprises a first terminal connection (23, 25) for electrically connecting the circuit configuration (1) to an insulated gate terminal of a bridge valve (15, 17) of the half-bridge (13), a second terminal connection (20, 22) for electrically connecting the circuit configuration (1) to an additional terminal of the bridge valve (15, 17), a lead (16, 18) electrically connecting the first terminal connection (23, 25) to the second terminal connection (20, 22), and an electric valve (43, 45) that can be switched on and off by pulse-width modulated signals. Said electric valve (43, 45) is disposed in the lead (16, 18) so that a flow of current through the lead (16, 18) can be released and blocked. The invention is specifically characterized in that at least one inductive component (35, 37) is provided in the lead (16, 18) so that a time course of an electric current flow in the lead (16, 18) is influenced by the inductance of the inductive component (35, 37), in addition to the influence of a possibly present parasitic inductance.

17 Claims, 3 Drawing Sheets

FOREIGN PATENT DOCUMENTS

| | | |
|---|---|---|
| DE | 201 04 214 U1 | 7/2001 |
| JP | 62256528 | 11/1987 |
| JP | 63048155 A | 2/1988 |
| JP | 05299589 A | 11/1993 |
| JP | 11299221 | 10/1999 |
| WO | 01/63763 A2 | 8/2001 |

* cited by examiner

OPERATION OF A HALF-BRIDGE, IN PARTICULAR A FIELD-EFFECT TRANSISTOR HALF-BRIDGE

BACKGROUND OF THE INVENTION

Field of the Invention

The invention relates to a circuit configuration and a method for controlling the operation of a half-bridge by means of pulse-width modulation, in particular in synchronous rectifier mode. The half-bridge has at least one controllable bridge valve which has a gate terminal that is electrically insulated against current-carrying terminals of the bridge valve.

Field-effect transistor half-bridges and other half-bridges having, for example, IGBTs are used in particular in current rectifiers and DC/DC voltage converters, e.g. in the automotive engineering field.

Automotive electrical systems with subsidiary vehicle electrical systems having different rated voltages, in particular 36 volts and 12 volts, have already been proposed. The subsidiary vehicle electrical systems are coupled to one another via a DC/DC converter by means of a MOSFET half-bridge. In this configuration a current generator is connected to the subsidiary vehicle electrical system with a rated voltage of 36 volts. It is therefore a function of the DC/DC converter to transfer electrical energy into the subsidiary vehicle electrical system with a rated voltage of 12 volts.

However, it can also happen that electrical energy has to be transferred in the reverse direction into the subsidiary vehicle electrical system with a rated voltage of 36 volts. Owing to the large energy currents occurring, power semiconductors are required for the DC/DC converter. For this reason n-channel MOSFETs are predominantly used in the half-bridge.

In synchronous rectifier operation, both bridge valves of the half-bridge are activated in order to reduce losses and enable an effective energy current to flow also into the subsidiary vehicle electrical system with the higher rated voltage.

When one of the bridge valves is switched off, charge must be dissipated from the insulated gate terminal of the bridge valve or supplied to it, depending on the type of the bridge valve. The remainder of the present description and the claims will deal only with the case wherein, in accordance with the conventional current direction, a current must flow away from the positively charged gate terminal (e.g. gate of an n-channel MOSFET). However, all parts of the description also apply analogously to the reverse case, e.g. that of a p-channel MOSFET. In that case the alignment of any direction-selective circuit components would need to be adjusted, e.g. the reverse (bias) and forward direction of diodes would need to be reversed.

When the bridge valve is switched off, steep voltage edges occur which must be taken into account with regard to electromagnetic compatibility (EMC) in the configuration of components and circuit configurations that are involved.

In particular there is the risk that owing to the capacitive coupling between the gate terminal and the current-carrying terminals (as a result of which a capacitive voltage divider is formed) and owing to the increasing voltage at the current-carrying terminals the voltage between the gate terminal and a first of the current-carrying terminals (e.g. between gate and source) is again raised to a value (or does not fall below this value) which is above the threshold voltage required to switch on the bridge valve. The consequence would be a bridge short-circuit which causes losses and EMC interferences.

One possibility of countering this risk is to apply a negative driver voltage in order to keep the gate terminal in a state which ensures that the voltage induced by the capacitive coupling does not reach the threshold voltage. However, this means greater overhead for the corresponding driver, which therefore becomes more expensive to manufacture.

A further possibility is to connect an external capacitor in the circuit in parallel with the inherent capacitance (e.g. between gate and source) and in this way increase the overall capacitance. This causes the voltage between said terminals to increase more slowly and/or a smaller voltage to be set. With this solution the overhead for removing the charge from the gate terminal when switching off or for supplying the charge to the gate terminal when switching on is increased. As a result the driver must be dimensioned for switching larger currents in the same switching time, which in turn makes it more expensive to manufacture, or longer switching times must be accepted.

Yet another possibility is to configure the driver area involved in the current flow to and from the gate terminal such that it has a particularly low inductance. By this means it is possible to counteract an undesirable charging of the gate terminal by carrying away charge in a short time, i.e. allowing the requisite large currents to flow from the gate terminal. The requirements for this are the immediate physical proximity of the driver area to the gate terminal and a suitably complex design of driver for handling the control actions.

SUMMARY OF THE INVENTION

It is an object of the present invention to provide a circuit configuration and a method of the type cited at the beginning which effectively prevent a bridge short-circuit due to unintentional charging of the gate terminal and do so with a minimum of circuit engineering overhead.

The object is achieved by a circuit configuration with the features recited in claim 1 and by a method with the features recited in claim 9. Developments are the subject matter of the respective dependent claims.

A circuit configuration for controlling the operation of a half-bridge by means of pulse-width modulation, in particular in synchronous rectifier mode, is proposed, comprising the following:

a first terminal connection for electrically connecting the circuit configuration to an insulated gate terminal (in particular one) of a bridge valve of the half-bridge, a second terminal connection for electrically connecting the circuit configuration to a further terminal, in particular a source terminal, of the bridge valve, an electrical lead which electrically connects the first terminal to the second terminal, and an electrical valve that can be switched on and off by pulse-width modulated signals, said electrical valve being disposed in the lead so that a flow of current through the lead can be released and blocked.

The circuit configuration is characterized by at least one inductive component disposed in the said lead so that a time progression of an electrical current flow in the lead is influenced by an inductance of the inductive component in addition to an influence of any parasitic inductance that may be present.

By terminal connection it is also understood that a corresponding electrical connection is already established by a continuous electrical lead. In particular the circuit configuration can form a circuitry unit together with the half-bridge.

What can be achieved by means of the additional inductance of the at least one inductive component is that the current flow from the gate terminal of the bridge valve will be maintained for a longer time and/or more stably than would be the case without the additional inductance: the inductance counteracts a reversed current flow due to an increasing voltage in the bridge valve. Thus, in contrast to the above described approach aimed at minimizing the inductance in order to be able to switch large currents as quickly as possible, precisely the opposite path is taken. Instead of counteracting an undesirable charging of the gate terminal by active measures, the current flow is stabilized from within the gate terminal.

Although an unavoidable switching delay occurs due to the inductance, the size of the inductance can be chosen such that the switching time is acceptable. The size of the additional inductance should therefore be adjusted to the particular application. Moreover, in spite of a small additional inductance it is also possible to take further measures, as will be described in greater detail below, to maintain the stabilization effect of the inductance over a comparatively long period of time.

For example, in contemporary integrated driver circuits it is possible to achieve inductances that are typically substantially less than 100 nH. This specification relates to the lead via which the charge is removed from the gate terminal. In a development it is proposed that the inductance of the one inductive component or of the plurality of inductive components in the lead amounts in total to at least 500 nH, and preferably to at least 2 pH.

With integrated circuits this can be achieved, for example, if the at least one component has an area consisting of ferri- and/or ferromagnetic material and/or soft magnetic material (e.g. made of ferrite), or more particularly consists entirely of ferri- and/or ferromagnetic or soft magnetic material. For example, a bead-shaped or droplet-like area made of said material can be deposited onto a carrier material (a substrate, for instance, or a printed circuit board).

In a particularly preferred development by means of which the time progression of the current flow from the gate terminal can be influenced, an electrical one-way valve is connected in the circuit between the first terminal connection and the second terminal connection so that the electrical valve that can be switched on and off, the at least one inductive component, corresponding electrically connecting sections of the lead, and the electrical one-way valve form a mesh. In this configuration the electrical one-way valve is connected in the circuit such that a direct current flow from the first terminal connection through the electrical one-way valve to the second terminal connection is blocked, but a current flow in the opposite direction through the electrical one-way valve is possible.

When the bridge valve is switched off, a current which flows through the inductance begins to flow out from the gate terminal. At time progresses, therefore, the voltage between the first terminal connection and the second terminal connection is reduced.

Finally, if the one-way valve is a semiconductor diode, the sign of the voltage is reversed. The process then continues until a voltage roughly equivalent to the breakdown voltage of the diode is reached. This value can be sustained over a long period of time because the inertia of the inductance maintains a corresponding current flow through the mesh.

As a result a voltage dropping via the one-way valve is therefore present between the first terminal connection and the second terminal connection, said voltage counteracting a recharging of the gate terminal on account of the capacitances present in the bridge valve and on account of a voltage dropping via the switched-off bridge valve. Furthermore the current flow through the mesh maintained by the inductance also stabilizes the charge state of the gate terminal. If, namely, a charging of the gate terminal were to take place, the corresponding charge would be dissipated in the current flow direction.

The mesh forms an oscillating circuit attenuated by the ohmic resistances involved. However, because of the electrical one-way valve it is not necessary to select large ohmic resistances and thereby prevent a reversal of the current direction.

In one development, in particular of this embodiment, an electrical one-way valve (to differentiate: a second one-way valve) is connected in the circuit in parallel with the inductive component (35, 37) or, as the case may be, with at least one of the inductive components. In addition, a resistance is preferably connected in the circuit, also in parallel with the inductive component, in series with the second one-way valve. The second electrical one-way valve is connected such that a current flow from the first terminal connection through the second electrical one-way valve to the second terminal connection is blocked, though a current flow in the opposite direction through the second electrical one-way valve is possible. If the gate terminal is discharged, the second one-way valve is therefore blocked. If, on the other hand, the gate terminal is charged, a current can flow in parallel through the branch with the second one-way valve and through the inductance into the gate terminal.

This permits a fast switching-on of the bridge valve owing to the possible greater current flow. In addition, the current flowing through the inductance when the bridge valve is switched on is less. For this reason it is possible to reverse the current direction through the inductance more quickly and switch off the bridge valve once again.

In another beneficial embodiment, a resistance (possibly comprising a plurality of sub-resistances) is connected in series with the at least one inductive component into the lead via which the charge is removed from the gate terminal. When the bridge valve is connected to the circuit configuration, the capacitance inherent in the bridge valve between the first and the second terminal connection, the inductance and the resistance form an oscillating circuit. In particular the resistance is dimensioned such that the threshold voltage of the bridge valve after it has been switched off is not reached again owing to the attenuation of the oscillation by the resistance. The resistance is preferably chosen such that the sign of the voltage present between the first and the second terminal connection is reversed and then approaches the value zero without reversing its sign again before a subsequent switching-on of the bridge valve if no voltage edge leading to an increase in the voltage above zero occurs at the two current-carrying terminals of the bridge valve.

Furthermore, the half-bridge is preferably operated and/or the circuit configuration configured such that a voltage edge occurring at the two current-carrying terminals of the bridge valve after it is switched off only occurs when the voltage present between the first and the second terminal connection of the circuit configuration has reversed its sign. This has the advantage that the insulated gate terminal of the bridge valve is negatively pre-charged at the time the voltage edge occurs and consequently the threshold voltage is not reached or not reached so quickly.

Owing to the inductance, however, the current through the inductance (and therefore coming from within the gate terminal) also continues to flow in the same direction after the voltage has reversed its sign.

The size of the resistance and the earliest possible time of switching on again are preferably coordinated with one another such that the current through the inductance has dropped to a predetermined minimum value or to zero at that time. With a greater value of the resistance the current flow from the gate terminal when the bridge valve is switched off would be decelerated and consequently the switching-off delayed.

In particular, in addition to the (first) electrical valve that can be switched on and off and which is switched on when the bridge valve is switched off, a second electrical valve that can be switched on and off can be connected in series and is switched on when the bridge valve is in the switched-on state and switched off when the bridge valve is switched off. In this case an electrical one-way valve (e.g. a diode) can be connected in parallel with the first electrical valve that can be switched on and off so that a current flow from the first terminal connection (e.g. at gate) through the electrical one-way valve to the second terminal connection (e.g. at source) is blocked, although a current flow in the reverse direction through the electrical one-way valve is possible. This embodiment prevents the voltage dropping via the second electrical valve that can be switched on and off from becoming too large and an undesirable leakage current from starting to flow through said valve.

In one development at least one electrical one-way valve is connected in the circuit between the first terminal connection and the higher potential of a direct-current (DC) voltage source, the electrical one-way valve being connected in the circuit such that a current flow from the higher potential to the first terminal connection through the electrical one-way valve is blocked, yet a current flow in the reverse direction through the electrical one-way valve is possible. The DC voltage source supplies the charge for the gate terminal that is necessary when the bridge valve is switched on. By means of the electrical one-way valve it is possible to prevent too large a voltage dropping, due to the inductance, at the first valve that can be switched on and off, which voltage could destroy the said valve.

In addition to the embodiments of the circuit configuration described, a method for controlling the operation of a half-bridge by means of pulse-width modulation, in particular in synchronous rectifier mode, is proposed. According to this method, when a bridge valve of the half-bridge is switched off, an electrical current flow between an insulated gate terminal of the bridge valve on the one hand and a further terminal connection, in particular a source terminal, of the bridge valve or a component electrically connected to the further terminal of the half-bridge on the other hand is routed via an inductive component, with the result that a time progression of the electrical current flow is influenced by an inductance of the inductive component in addition to an influence of any parasitic inductance that may be present. As already described with reference to a special embodiment of the circuit configuration according to the invention, it is preferred that after the switching-off the electrical potential of the gate terminal is changed through the electrical current flow into a potential with reversed sign and that the reversed sign of the potential is retained using the inductance of the inductive component until the bridge valve is switched on again or until the potential changes its sign once again due to capacitive effects in the bridge valve. The potential is referred in particular to the potential of the further terminal connection.

The invention will now be explained in more detail in an exemplary manner with reference to the attached drawing. However, it is not restricted to the examples. The individual figures of the drawing show:

DESCRIPTION OF THE PREFERRED EMBODIMENTS

Figure 1:
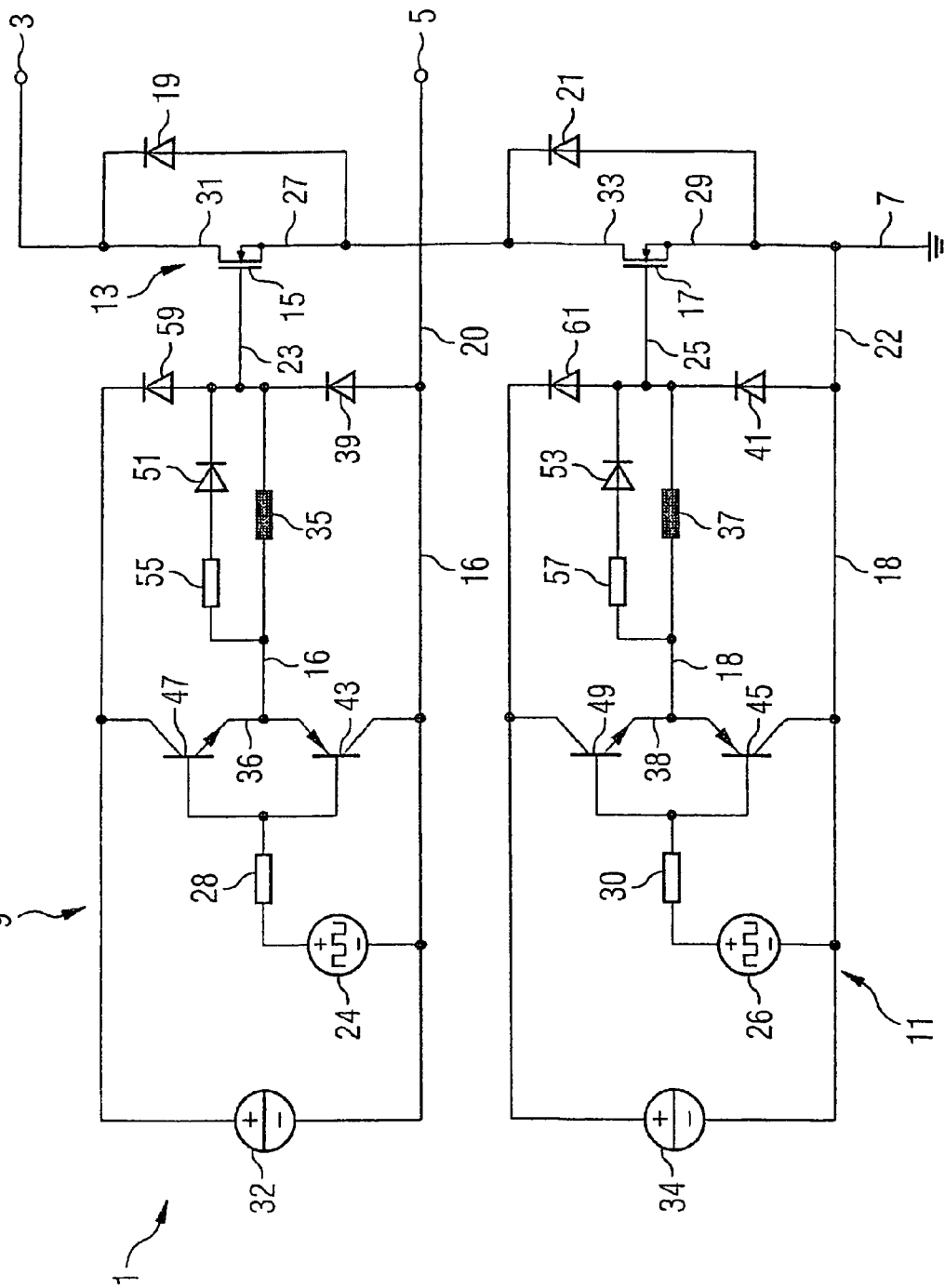
FIG. 1 a first, particularly preferred embodiment of a circuit configuration with connected field-effect transistor half-bridge, FIG. 2 a second embodiment of a circuit configuration with connected field-effect transistor half-bridge, FIG. 3 a time progression of a voltage between a gate terminal and a source terminal during and after the turning-off of a field-effect transistor of the half-bridge in the circuit configuration according to FIG. 2, and FIG. 4 a time progression of a voltage between a gate terminal and a source terminal during and after the turning-off of a field-effect transistor of the half-bridge in the circuit configuration according to FIG. 1.

FIG. 1 shows a circuit configuration 1 with a connected field-effect transistor half-bridge 13 which has two n-channel MOSFET (metal oxide semiconductor field-effect transistors) 15, 17 and in each case a freewheeling diode 19, 21 connected in parallel with the MOSFET 15, 17. A ground terminal 7 is connected to a source terminal 29 of the field-effect transistor 17 referred to in the following as the "lower" MOSFET. A drain terminal 33 of the lower MOSFET 17 is connected to a half-bridge output 5 which is connected e.g. via a power choke (not shown) to a subsidiary vehicle electrical system with a rated voltage of 12 volts.

Also connected to the half-bridge output 5 is a source terminal 27 of the field-effect transistor 15 referred to in the following as the "upper" MOSFET. A drain terminal 31 of the upper MOSFET 15 is connected to a DC voltage network terminal 3. A subsidiary vehicle electrical system with a rated voltage of 36 volts for example can be connected to the DC voltage network terminal 3.

The gate of the lower MOSFET 17 is connected to a gate terminal 25 of a first driver circuit 11. The gate of the upper MOSFET 15 is connected to a gate terminal 23 of a second driver circuit 9. A source terminal 22 of the first driver circuit 11 is connected to the ground terminal 7. A source terminal 20 of the second driver circuit 9 is connected to the half-bridge output 5. The first driver circuit 11 and the second driver circuit 9 are identical in layout. The layout will therefore be described below, referring in each case to the reference numerals of components of both driver circuits 9, 11.

The lower potential of a DC voltage source 32, 34 is connected to the source terminal 20, 22. A series circuit of two switching transistors 43 and 47 or, as the case may be, 45 and 49 is connected between the higher and the lower potential of the DC voltage source 32, 34, the emitters of the two transistors 43 and 47 or 45 and 49 being connected to one another via a common emitter section 36, 38. The bases of the two transistors 43 and 47 or 45 and 49 are likewise connected to one another and also connected via a resistance 28, 30 to a positive pole of a generator 24, 26 for generating pulse-width modulated signals. The negative pole of the generator 24, 26 is connected to the source terminal 20, 22. Since the two transistors 43 and 47 or, as the case may be, 45 and 49 are transistors of different types, one of the two transistors 43 and 47 or 45 and 49 is turned on by the same signal of the generator 24, 26 and the respective other of the two transistors 43 and 47 or 45 and 49 is turned off simultaneously.

The source terminal 20, 22 is connected to the gate terminal 23, 25 via a first diode 39, 41. The polarity of the first diode 39, 41 is such that a current flow from the source terminal 20, 22 to the gate terminal 23, 25 is possible, but a current flow in the reverse direction through the first diode 39, 41 is blocked.

The common emitter section 36, 38 is connected to the gate terminal 23, 25 via an inductance 35, 37 formed by means of an inductive component. The inductance lies, for example, in the range 10±2 μH. A series circuit with a first resistance 55, 57 and with a second diode 51, 53 is connected in parallel with the inductance 35, 37. The second diode 51, 53 is connected such that a current flow from the common emitter section 36, 38 in the direction of the gate terminal 23, 25 is possible, but a current flow in the reverse direction through the second diode 51, 53 is blocked.

The gate terminal 23, 25 is connected to the higher potential of the DC voltage source 32, 34 via a third diode 59, 61. The polarity of the third diode 59, 61 is such that a current flow from the gate terminal 23, 25 to the higher potential of the DC voltage source 32, 34 is possible, but a current flow in the reverse direction through the third diode 59, 61 is blocked.

Starting from the gate terminal 23, 25, a current path forms a lead 16, 18 via the inductance 35, 37, via a part of the common emitter section 36, 38, via the switching transistor 43, 45 connected to the lower potential of the DC voltage source 32, 34 and via the connection between the switching transistor 43, 45 to the source terminal 20, 22. When the MOSFET 15, 17 is turned off, charge from the gate of the MOSFET 15, 17 is drained off at least via a part of this lead 16, 18.

Processes when the MOSFET 15, 17 is turned off are described below also with reference to FIG. 4. At the same time reference is again made to the components of the two driver circuits 9, 11 and to the MOSFET 15, 17 connected thereto in each case, although the MOSFETs 15, 17 of the half-bridge 13 are turned on and off in opposite directions, and in practice even, before one of the two MOSFETs 15, 17 is turned on, a dead time is maintained in which neither of the two MOSFETs 15, 17 is turned on.

In the switched-on state the source terminal 27, 29 and the drain terminal 31, 33 of the MOSFET 15, 17 are connected to each other in an electrically conducting manner. In this state the switching transistor 47, 49 connected to the higher potential of the DC voltage source 32, 34 is turned on and the switching transistor 43, 45 connected to the lower potential of the DC voltage source 32, 34 is turned off. The gate is therefore connected to the higher potential of the DC voltage source 32, 34 via the switching transistor 47, 49 and via the inductance 35, 37 as well as via the series circuit 55 and 51 or, as the case may be, 57 and 53 connected in parallel with it.

If the switched-on state has already existed for a sufficiently long time, a very small current at best still flows through the inductance 35, 37 in the direction of the gate. The voltage $U_{GS}$ between the gate terminal 23, 25 and the source terminal 20, 22 is roughly equal to the voltage $U_0$ of the DC voltage source 32, 34.

In this state the turning-off of the MOSFET 15, 17 is initiated by turning off the switching transistor 47, 49 via a signal of the generator 24, 26 and at the same time the switching transistor 43, 45 connected to the lower potential of the DC voltage source 32, 34 is turned on. As a result the gate is connected to the lower potential of the DC voltage source 32, 34 via the inductance 35, 37 and via the switching transistor 43, 45. On account of the inductance 35, 37 a high current does not flow out of the gate immediately, but instead the current starts to increase roughly in accordance with the shape of a sine curve. Accordingly the voltage $U_{GS}$ decreases analogously to a cosine curve (FIG. 4).

As the current flow increases, the voltage $U_{GS}$ drops to the threshold voltage $U_{th}$ of the MOSFET 15, 17, at which the drain-to-source section becomes non-conducting. From this time the voltage between drain and source can increase steeply and the effect described at the beginning can be produced, which can lead to the gate becoming charged once again. The time at which the voltage edge occurs depends in particular on the current direction at the half-bridge output 5.

However, the current from the gate increases continuously and—stabilized by the inductance 35, 37—counteracts a new charging of the gate. As a result of the decreasing further current flow from the gate, the voltage $U_{GS}$ drops to negative values until, according to the amount, the threshold voltage $U_s$ of the diode 39, 41 is reached. At this point the curve shown in FIG. 4 breaks off and turns into a horizontal line. Thereafter a current—stabilized by the inductance 35, 37—circulates through the mesh formed by the lead 16, 18 and the first diode 39, 41 in the counterclockwise direction relative to FIG. 1.

As already explained in the general part of the description, the third diode 59, 61 serves to prevent too high a voltage at the turned-off switching transistor 43, 45 after the MOSFET 15, 17 is turned back on. If the potential at the gate terminal 23, 25 assumes higher values than the higher potential of the DC voltage source 32, 34, a current begins to flow through the third diode 59, 61 and reduces the too high voltage.

Figure 2:
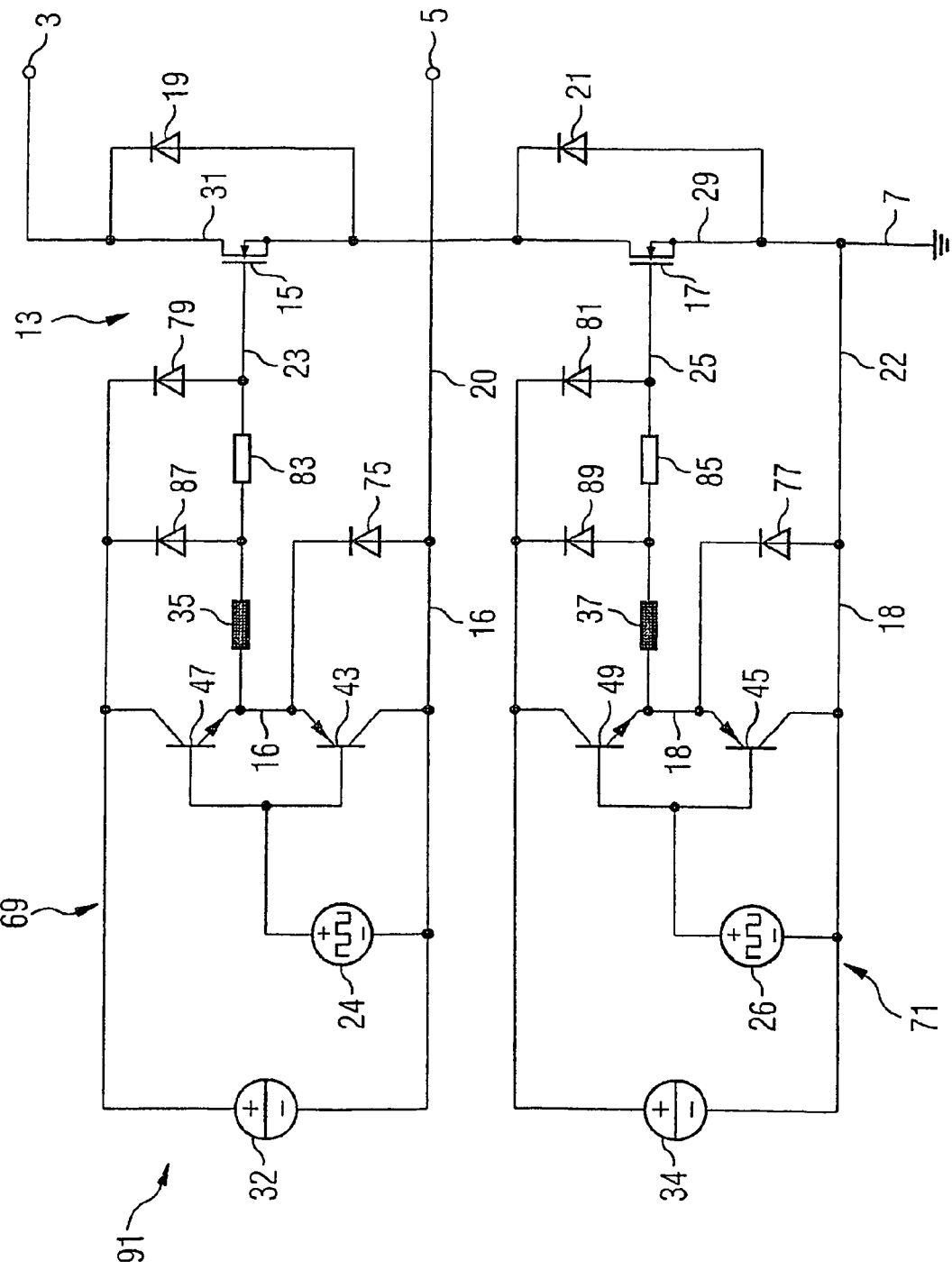

The circuit configuration 91 shown in FIG. 2, with field-effect transistor half-bridge 13 connected thereto, has extensive commonalities with the configuration shown in FIG. 1. It likewise has a first driver circuit 69 and a second driver circuit 71. Identical and functionally identical features are identified by the same reference numerals as in FIG. 1 and will not be explained again at this point. This applies in particular to the layout of the half-bridge 13. The differences are detailed below.

The differences all relate to the circuit area of the first driver circuit 69 or, as the case may be, second driver circuit 71 located between the series circuit of the switching transistors 43 and 47 or 45 and 49 and the gate terminal 23, 25 and the source terminal 20, 22.

The common emitter section 16, 18 of the two switching transistors 43 and 47 or, as the case may be, 45 and 49 is connected to the gate terminal 23, 25 via the inductance 35, 37 and via a resistance 83, 85 connected in series therewith. Both sides of the resistance 83, 85 are in each case connected via a diode 87, 89 or, as the case may be, 79, 81 to the higher potential of the DC voltage source 32, 34. In this case a current flow from the resistance 83, 85 to the higher potential of the DC voltage source 32, 34 is possible, but a current flow in the reverse direction through the diode 87, 89 or, as the case may be, 79, 81 is blocked. The diodes 87, 89 or, as the case may be, 79, 81 serve the same purpose as the diode 59, 61 from FIG. 1.

In addition, a further diode 75, 77 is connected between the lower potential of the DC voltage source 32, 34 and the common emitter section 16, 18. In this case a current flow from the lower potential of the DC voltage source 32, 34 to the common emitter section 36, 38 is possible, but a current flow in the reverse direction through the further diode 75, 77 is blocked.

According to the explanation in the general part of the description, the further diode 75, 77 serves to prevent the voltage between the common emitter section 16, 18 and the higher potential of the DC voltage source 32, 34 from becoming so great that the switching transistor 47, 49 connected to the higher potential is unintentionally turned on. This can occur in particular if the voltage $U_{GS}$ assumes negative values. When a threshold voltage is reached, the switching transistor 47, 49 could then conduct a leakage current that turns out to be so great that the threshold voltage is maintained and not exceeded.

Processes in the circuit configuration 91 when the MOSFET 15, 17 is turned off are described below also with reference to FIG. 3. Once again, only the differences from the circuit configuration 1 are dealt with.

Owing to the inductance 35, 37, when the MOSFET 15, 17 is turned off, a high current does not flow from the gate immediately, but instead the current begins to increase roughly in accordance with the shape of a sine curve. Accordingly the voltage $U_{GS}$ in turn decreases analogously to a cosine curve (FIG. 4). Unlike the circuit configuration 1 according to FIG. 1, however, no diode 39, 41 connected directly between the gate terminal 23, 25 and the source terminal 20, 22 is provided. A current therefore cannot circulate in the same way. Nevertheless, after the drain-to-source section of the MOSFET 15, 17 has become electrically non-conducting once the threshold voltage $U_{th}$ has been reached, an undesirable re-charging of the gate is still prevented. In this case the inductance 35, 37 and the resistance 83, 85 act in concert.

The resistance 83, 85 attenuates an-oscillation of an oscillating circuit formed, inter alia, by the inductance 35, 37 and by the capacitance between gate and source present in the MOSFET 15, 17 in the sense that, after negative values have been reached and before the MOSFET 15, 17 is turned on once more, the voltage $U_{GS}$ does not assume positive values again, but gradually approaches zero. This applies in any case when no or only a small voltage edge occurs between source and drain when the MOSFET 15, 17 is in the off state. If a large voltage edge occurs, the voltage $U_{GS}$ can again assume positive values, though the latter will turn out to be smaller than without the measures described.

Accordingly the current continues to flow away from the gate through the inductance 35, 37 on account of the latter's stabilizing effect, even after the voltage $U_{GS}$ has assumed negative values. The current direction reverses again only when the voltage $U_{GS}$ has reached its minimum. The current decreases to zero over a long period of time, until the MOSFET 15, 17 is turned on again.

To sum up, it may be stated that by means of an inductance in the gate lead a charging of the gate before the field-effect transistor is turned on again can be effectively prevented.

We claim:

1. A circuit configuration for controlling an operation of a half-bridge by way of pulse-width modulation, the half-bridge having a bridge valve with an insulated gate terminal and a further terminal, the circuit configuration comprising:

a first terminal connection for electrically connecting the circuit configuration to the insulated gate terminal of the bridge valve of the half-bridge;

a second terminal connection for electrically connecting the circuit configuration to the further terminal of the bridge valve;

an electrical lead electrically connecting said first terminal connection and said second terminal connection to one another;

an electrical valve configured to be selectively switched on and switched off by way of pulse-width modulated signals, said electrical valve being connected in said electrical lead enabling or blocking current flow through said electrical lead;

at least one inductive component connected in said electrical lead for influencing a time progression of an electric current flow in said electrical lead; and a resistance device connected in said electrical lead in series with said at least one inductive component.

2. The circuit configuration according to claim 1, configured to drive the bridge circuit in synchronous rectifier mode.

3. The circuit configuration according to claim 1, wherein the further terminal of the bridge valve is a source terminal.

4. The circuit configuration according to claim 1, wherein an inductance of said at least one inductive component in said electrical lead amounts to at least 500 nH.

5. The circuit configuration according to claim 4, wherein the inductance amounts to at least 2 µH.

6. The circuit configuration according to claim 1, wherein said at least one inductive component is one of a plurality of inductive components having a total inductance of at least 500 nH.

7. The circuit configuration according to claim 6, wherein the total inductance amounts to at least 2 µH.

8. The circuit configuration according to claim 1, wherein said at least one inductive component has an area consisting of ferrimagnetic and/or ferromagnetic material.

9. The circuit configuration according to claim 1, which comprises an electrical one-way valve connected in parallel with said electrical valve, for blocking a current flow from said first terminal connection through said electrical one-way valve to said second terminal connection, while enabling a current flow in a reverse direction through said electrical one-way valve.

10. The circuit configuration according to claim 1, which comprises an electrical one-way valve connected between said first terminal connection and said second terminal connection, with said electrical valve, said at least one inductive component, corresponding electrical connection sections of said electric lead, and said electrical one-way valve forming a mesh, and wherein said electrical one-way valve is connected to block a direct current flow from said first terminal connection through said electrical one-way valve to said second terminal connection, but enabling a current flow in a reverse direction through said electrical one-way valve.

11. The circuit configuration according to claim 1, which comprises an electrical one-way valve connected in parallel with said at least one inductive component for blocking a current flow from said first terminal connection through said electrical one-way valve to said second terminal connection, while enabling a current flow in a reverse direction through said electrical one-way valve.

12. The circuit configuration according to claim 11, wherein said electrical one-way valve is connected in series with a resistance.

13. The circuit configuration according to claim 1, which comprises at least one electrical one-way valve connected between said first terminal connection and a higher potential of a DC voltage source, and wherein said electrical one-way valve is connected to block a current flow from the higher potential to said first terminal connection through said electrical one-way valve, but to enable a current flow in a reverse direction through said electrical one-way valve.

14. A method for controlling an operation of a half-bridge by way of pulse-width modulation, the method which comprises:
providing a half-bridge with a bridge valve having an insulated gate terminal and a further terminal;
when the bridge valve is switched off, conducting an electric current flow between the insulated gate terminal and the further terminal or a component electrically connected to the further terminal through an inductive component, to thereby influence a time progression of the electrical current flow with an inductance of the inductive component; and
conducting the electric current flow through a resistance connected in series with the at least one inductive component.

15. The method according to claim 14, which comprises driving the half-bridge in synchronous rectifier mode.

16. The method according to claim 14, which comprises, after the bridge valve is switched off, changing an electrical potential of the gate terminal by the electrical current flow into a potential with reversed sign and maintaining the reversed sign of the potential by using the inductance of the inductive component until the bridge valve is once more switched on or until the potential once again changes sign due to capacitive effects in the bridge valve.

17. The circuit configuration according to claim 1, wherein said at least one inductive component is one of a plurality of inductive components, and an electrical one-way valve is connected in parallel with at least one of said inductive components, and wherein said electrical one-way valve is connected to block a current flow from said first terminal connection through said electrical one-way valve to said second terminal connection, while enabling a current flow in a reverse direction through said electrical one-way valve.

* * * * *